United States Patent
Wu et al.

(10) Patent No.: US 8,659,904 B2
(45) Date of Patent: Feb. 25, 2014

(54) SOLID STATE DISK ASSEMBLY

(75) Inventors: Kang Wu, Shenzhen (CN); Guo-Yi Chen, Shenzhen (CN)

(73) Assignees: Hong Fu Jin Precision Industry (ShenZhen) Co., Ltd, Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 146 days.

(21) Appl. No.: 13/310,716

(22) Filed: Dec. 3, 2011

(65) Prior Publication Data

US 2013/0050928 A1  Feb. 28, 2013

(30) Foreign Application Priority Data

Aug. 25, 2011 (CN) .......................... 2011 1 0246232

(51) Int. Cl.
*H05K 7/20* (2006.01)
(52) U.S. Cl.
USPC .......................................... 361/720; 361/760
(58) Field of Classification Search
USPC .................... 361/679.02, 679.31, 679.32, 361/679.46–679.54, 679.58, 709, 710, 720, 361/760, 784, 785
See application file for complete search history.

(56) References Cited

U.S. PATENT DOCUMENTS

| | | | | |
|---|---|---|---|---|
| 6,535,387 B2* | 3/2003 | Summers et al. | ............. | 361/704 |
| 6,765,797 B2* | 7/2004 | Summers et al. | ............. | 361/704 |
| 6,775,139 B2* | 8/2004 | Hsueh | ............. | 361/697 |
| 7,106,595 B2* | 9/2006 | Foster et al. | ............. | 361/721 |
| 7,151,669 B2* | 12/2006 | Liu | ............. | 361/707 |
| 7,221,569 B2* | 5/2007 | Tsai | ............. | 361/704 |
| 7,349,220 B2* | 3/2008 | Lai et al. | ............. | 361/719 |
| 7,375,964 B2* | 5/2008 | Lai et al. | ............. | 361/704 |
| 7,391,613 B2* | 6/2008 | Lai et al. | ............. | 361/700 |
| 7,400,506 B2* | 7/2008 | Hoss et al. | ............. | 361/715 |
| 7,457,122 B2* | 11/2008 | Lai et al. | ............. | 361/704 |
| 7,480,147 B2* | 1/2009 | Hoss et al. | ............. | 361/721 |
| 7,532,477 B2* | 5/2009 | Hsu | ............. | 361/704 |
| 7,684,197 B2* | 3/2010 | Zhu et al. | ............. | 361/719 |
| 7,791,881 B2* | 9/2010 | Chou et al. | ............. | 361/695 |
| 7,817,426 B2* | 10/2010 | Tamori | ............. | 361/704 |
| 7,957,141 B2* | 6/2011 | Chou et al. | ............. | 361/695 |
| 8,081,474 B1* | 12/2011 | Zohni et al. | ............. | 361/719 |
| 2001/0019913 A1* | 9/2001 | Llapitan et al. | ............. | 439/327 |
| 2002/0080541 A1* | 6/2002 | Bunker et al. | ............. | 361/72 |
| 2003/0026076 A1* | 2/2003 | Wei | ............. | 361/704 |
| 2007/0070607 A1* | 3/2007 | Goodwin | ............. | 361/719 |
| 2007/0217160 A1* | 9/2007 | Legen et al. | ............. | 361/704 |

\* cited by examiner

*Primary Examiner* — Adrian S Wilson
(74) *Attorney, Agent, or Firm* — Altis Law Group, Inc.

(57) ABSTRACT

A solid state disk assembly includes a solid state disk, a first heat conducting member and a second heat conducting member. The solid state disk includes a printed circuit board (PCB) and a chipset. The PCB includes a front surface, a rear surface, a first end, and a second end. The chipset is mounted on the front surface. The first heat conducting member abuts the chipset for absorbing heat generated by the solid state disk and includes at least a pair of elastic arms. The second heat conducting member attaches on the rear surface and includes at least a pair of engaging arms spatially corresponding to the at least one pair of elastic arms. The first end and the second end are clamped between the at least one pair of elastic arms. Each elastic arm engages with a respective one of the engaging arms.

9 Claims, 4 Drawing Sheets

SOLID STATE DISK ASSEMBLY

BACKGROUND

1. Technical Field

The present disclosure relates to solid state disk (SSD) assemblies and, particularly, relates to a solid state assembly capable of efficiently dissipating heat.

2. Description of Related Art

Serial technology attachment dual-inline-memory-module SSD (SATA DIMM SDD) is one type of SSD which has the same appearance as a double data rate generation three (DDR3) memory module. The SATA DIMM SDD usually generates a lot of heat when working. The heat may shorten the service life of the SATA DIMM SDD. Thus, fans may be used as heat dissipation devices for the SATA DIMM SDD. However, this increases cost and incurs an excess of energy consumption.

Therefore, it is desirable to provide a disclosure, which can overcome the limitations described above.

DETAILED DESCRIPTION

Embodiments of the present disclosure will now be described in detail with reference to the drawings.

Figure 1:
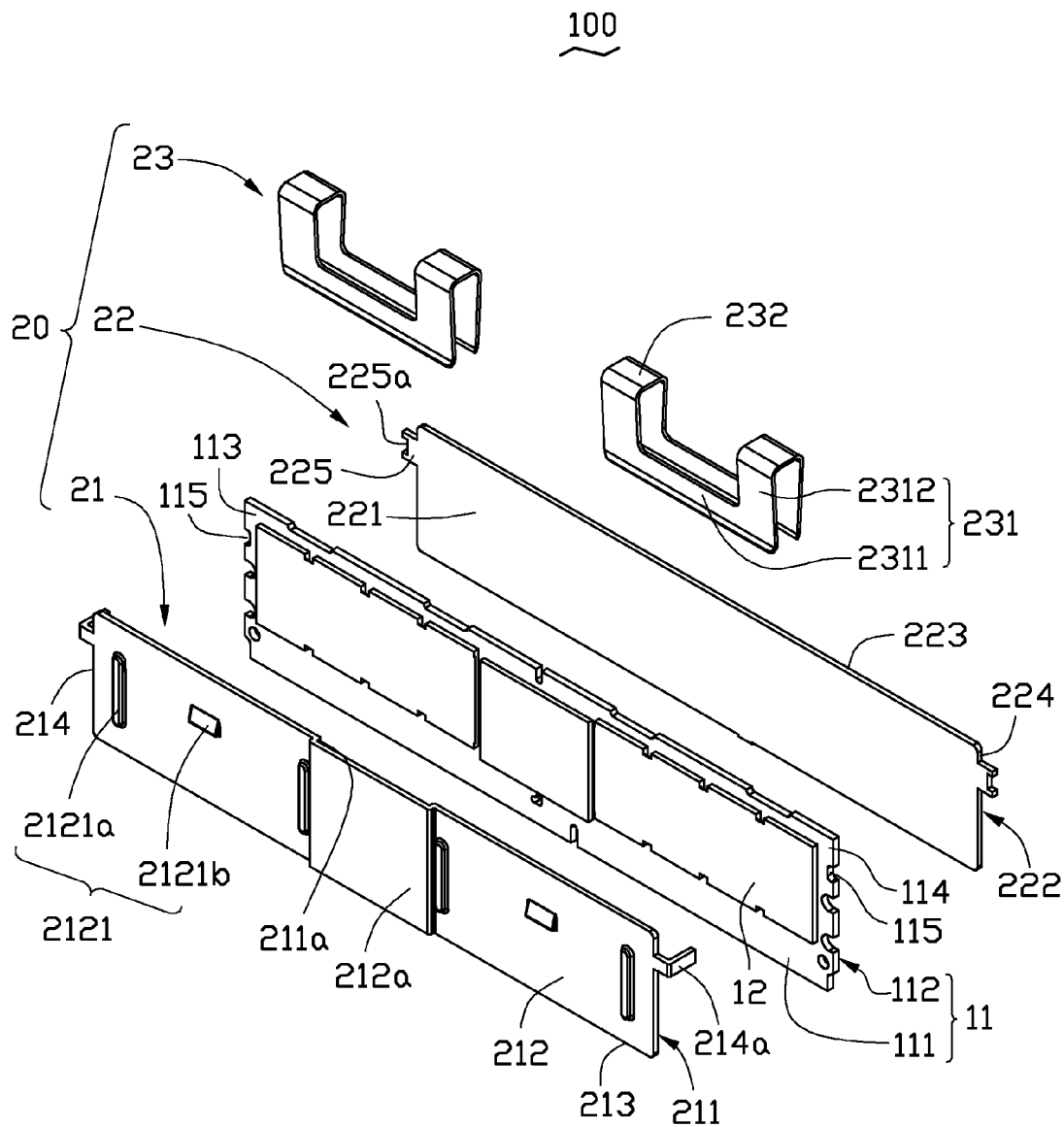
FIG. 1 is an isometric, exploded view of an SSD assembly according to an exemplary embodiment.
Figure 2:
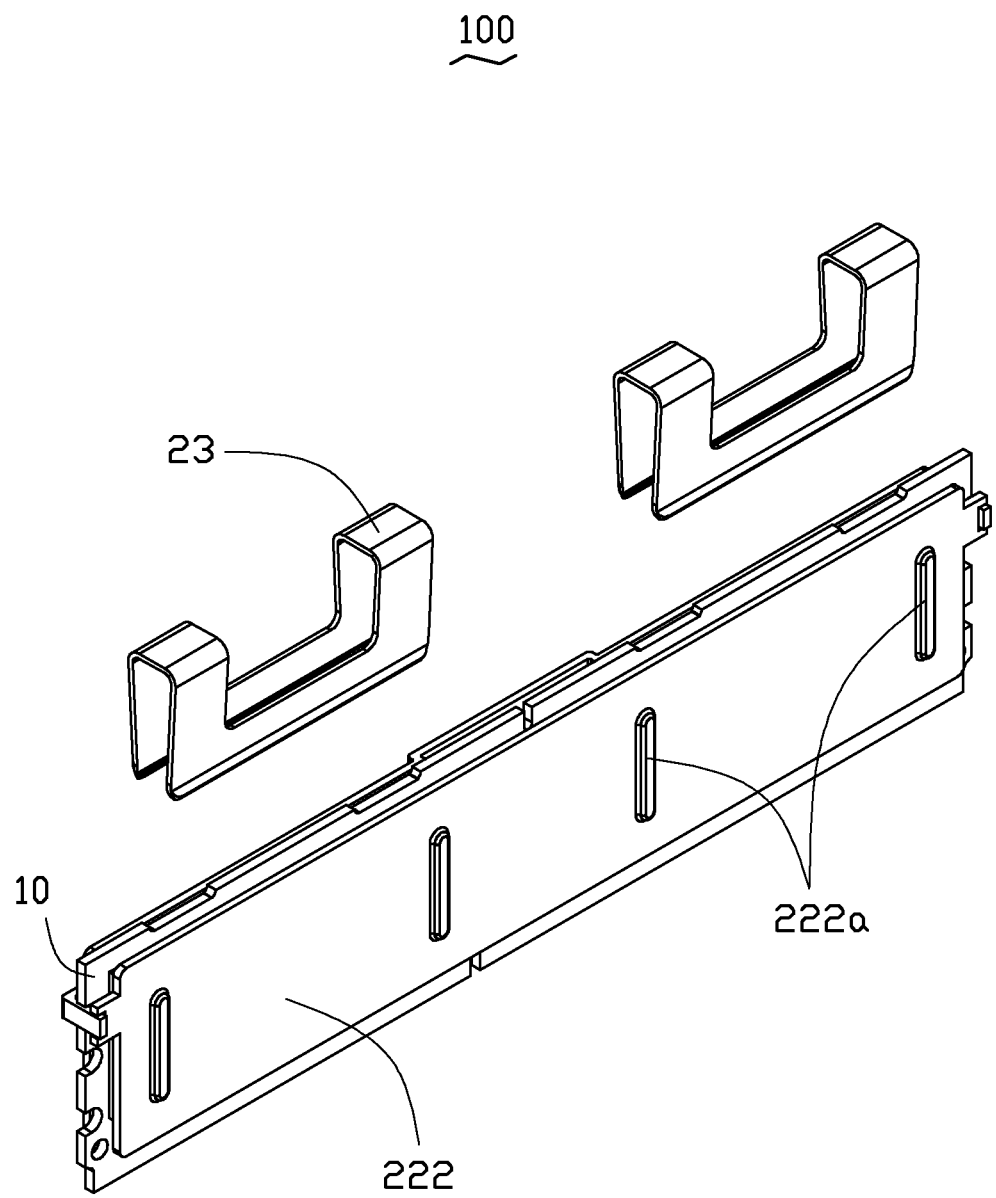
FIG. 2 is an isometric, partially assembled view of the SSD assembly of FIG. 1.
Figure 3:
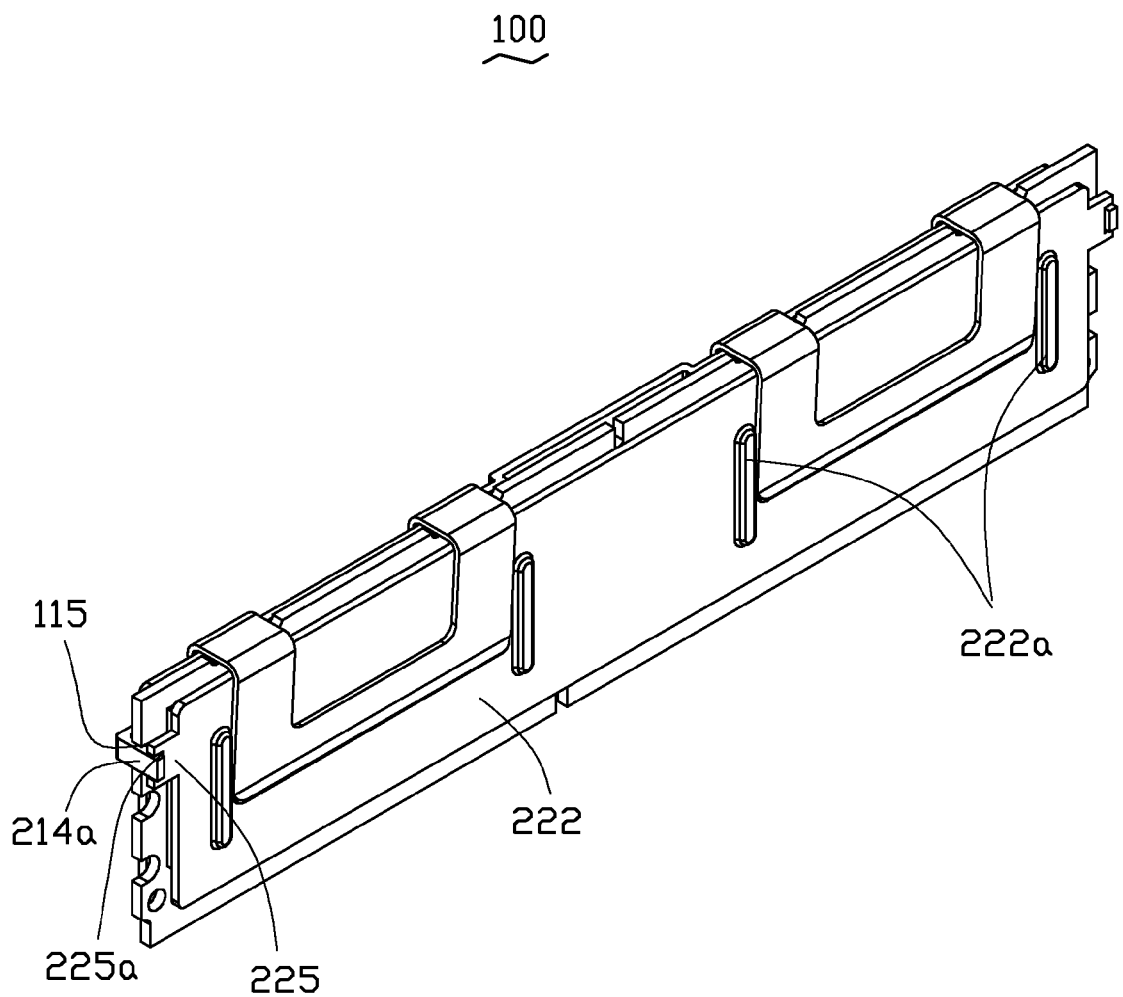
FIG. 3 is an isometric, assembled view of the SSD assembly of FIG. 2.

Referring to FIGS. 1 to 3, an SSD assembly 100, according to an exemplary embodiment, includes an SSD 10 and a heat dissipation component 20.

The SSD 10 includes a printed circuit board (PCB) 11 and a chipset 12. The PCB 11 is generally rectangular and includes a front surface 111, a rear surface 112 opposite to the front surface 111, a first end 113, and a second end 114 opposite to the first end 113. Each of the first end 113 and the second end 114 defines an aligning notch 115. The chipset 12 are mounted on the front surface 111 by, for example, soldering. In the present embodiment, the SSD 10 is an SATA DIMM SDD, the chipset 12 include a plurality of memories such as flash memories and processing units for controlling the memories and other electronic elements.

The heat dissipation component 20 includes a first heat conducting member 21, a second heat conducting member 22, and two clamping members 23.

The first heat conducting member 21 is made of metal. In one embodiment, the first heat conducting member 21 is made of aluminum. The first heat conducting member 21 is generally rectangular and has a symmetrical structure. The first heat conducting member 21 includes a first surface 211, a second surface 212 opposite to the first surface 211, a pair of first long sides 213, and a pair of first short sides 214. The middle of the second surface 212 is stepped out from the first surface 211 such that a groove 211a is formed on the first surface 211 and a protruding portion 212a is formed on the second surface 212. The second surface 212 is equipped with two groups of engaging portions 2121. The two groups of engaging portions 2121 symmetrically flank the protruding portion 212a. Each group of engaging portions 2121 includes a pair of first limiting ribs 2121a extending up from the second surface 212 and a hook portion 2121b extending up from the second surface 212. The pair of first limiting ribs 2121a resemble stripes and are parallel to each other and parallel to the first short sides 214. The hook portion 2121b is positioned between each pair of first limiting ribs 2121a. The first heat conducting member 21 further includes a pair of elastic arms 214a. Each elastic arm 214a extends from a first short side 214 along a direction substantially perpendicular to the second surface 212 and away from the second surface 212. Each elastic arm 214a corresponds to an aligning notch 115. In this embodiment, the pair of elastic arms 214a are aligned with each other along a direction parallel to the first short sides 214. The two aligning notches 115 are aligned with each other along the direction parallel to the first short sides 214. The distance between each pair of elastic arms 214a is slightly less than the distance between the aligning notches 115.

The second heat conducting member 22 is also made of metal. In one embodiment, the first heat conducting member 21 is made of aluminum. The second heat conducting member 22 is generally a rectangular plate and includes a third surface 221, a fourth surface 222 opposite to the third surface 221, a pair of second long sides 223 and a pair of second short sides 224 substantially perpendicular to the second long sides 223. Two pairs of second limiting ribs 222a extend up from the fourth surface 222. Each pair of second limiting ribs 222a are parallel to each other and parallel to the second short sides 224. Each pair of second limiting ribs 222a corresponds to a pair of first limiting ribs 2121a. The second heat conducting member 22 further includes a pair of engaging arms 225. Each engaging arm 225 is a shaped extension of a second short side 224. Each engaging arm 225 defines a recess 225a at a distal end. Each recess 225a corresponds to an elastic arm 214a. In this embodiment, each one of the pair of engaging arms 225 is aligned with each other. The distance between the recesses 225a of the engaging arms 225 corresponds the distance between the elastic arms 214a.

Each of the clamping members 23 is stamped out of a metal such as aluminum and shaped. The clamping member 23 includes a pair of clamping plates 231 and two connection portions 232. The clamping plates 231 of each clamping member 23 are opposite to each other. Each of the clamping plates 231 is bent into a "U" shape and includes a first section plate 2311 and two second section plates 2312 substantially perpendicularly connected to two ends of the first section plate 2311. Each of the connection portions 232 is connected to two second section plates 2312 of the pair of clamping plate 231. The pair of clamping plates 232 of each clamping member 23 are configured for placement between a pair of first limiting ribs 2121 a and a pair of second limiting ribs 222a.

Figure 4:
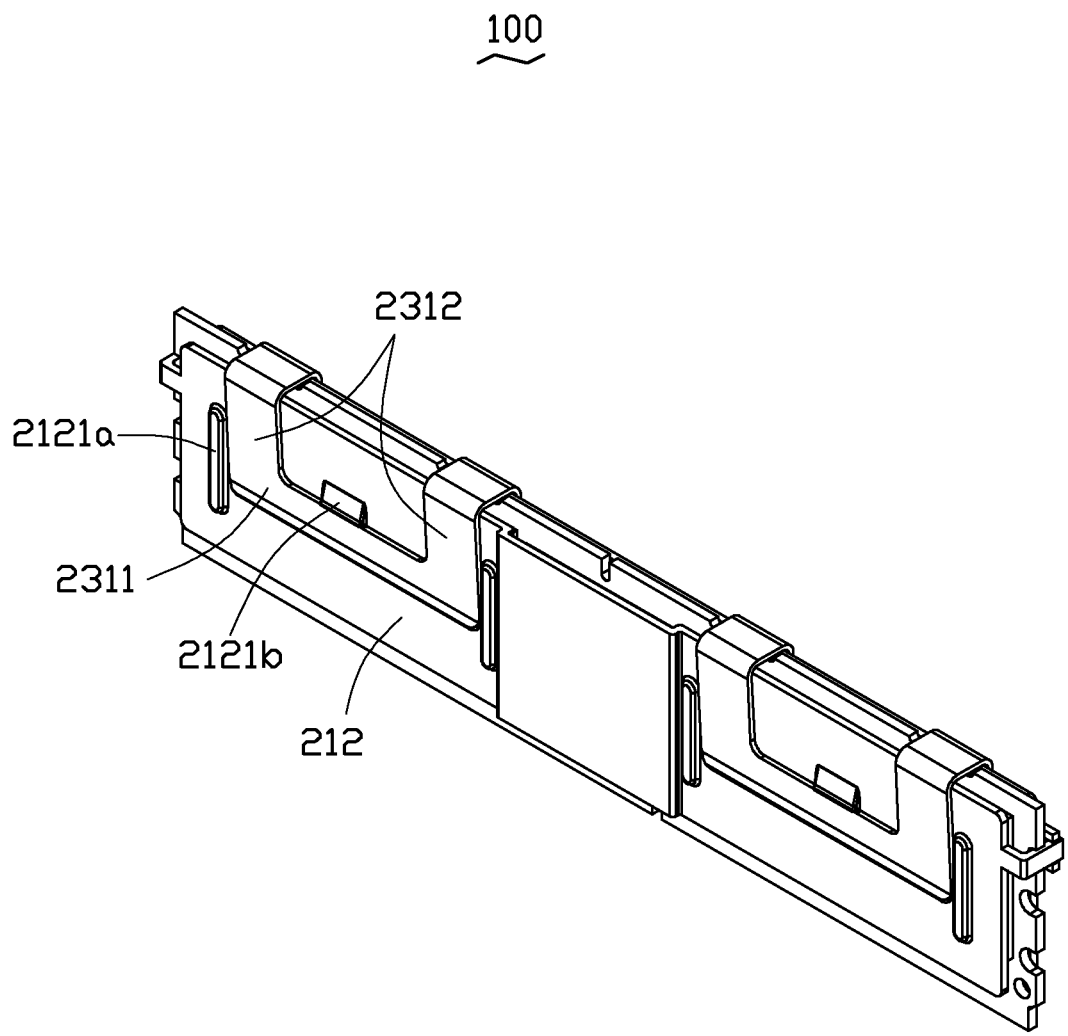
FIG. 4 is similar to FIG. 3, but viewed from another angle.

Further referring to FIGS. 3 and 4, when assembling, the third surface 221 is attached to the rear surface 112, so each of the aligning notches 115 is aligned with a recess 225a. The first surface 211 is populated with and abutted on the chipset 12. The groove 211a and the chipset 12 cooperatively form a channel for the passage of air (not labeled) to encourage cooling by air. Each of the elastic arms 214a is partially received and clamped in a corresponding aligning notch 115 and a corresponding recess 225a, such that the first heat conducting member 21 and the second heat conducting member 22 clamps each other with the SSD 10 being clamped therebetween. Each of the clamping members 23 then clamps the first heat conducting member 21 and the second heat conducting member 22 together. One clamping plate 231 of each clamping member 23 attaches on the second surface 212 between a pair of first limiting ribs 2121a and the other clamping plate 231 attaches on the fourth surface 222 between a pair of second limiting ribs 222a. The first section plate 2311 of the clamping plate 231 attaching on the second surface 212 makes contact with, and engages, a corresponding hook 2121b.

When the SSD 10 is working, the first heat conducting member 21 and the second heat conducting member 22 absorb the heat generated by the SSD 10, such that the service life of the SSD 10 is extended.

In alterative embodiments, the heat dissipation component 20 can include only one clamping member 23.

In alterative embodiments, the first heat conducting member 21 can include more than one pair of elastic arms 214a, and, accordingly, the second heat conducting member 22 can include more than one pair of engaging arms 225.

In alterative embodiments, each group of engaging portions 2121 can include only one pair of first limiting ribs 2121a or include only a hook.

In alterative embodiments, the second limiting ribs 222a can be omitted.

In alterative embodiments, the aligning notches 115 can be omitted. The distance between the elastic members 214a is slightly less than or closely corresponding to the distance between the first end 113 and the second end 114.

It will be understood that the above particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A solid state disk assembly, comprising:
    a solid state disk comprising:
        a printed circuit board having a front surface, a rear surface, a first end, and a second end; and
        a chipset mounted on the front surface;
    a first heat conducting member abutted on the chipset for absorbing heat generated by the solid state disk, the first heat conducting member comprising at least a pair of elastic arms; and
    a second heat conducting member attached on the rear surface for absorbing the heat generated by the solid state disk, the second heat conducting member comprising at least one pair of engaging arms spatially corresponding to the at least a pair of elastic arms;
    wherein the first end and the second end are clamped between the at least one pair of elastic arms, each elastic arm engages with a respective one of the engaging arms;
    wherein the first heat conducting member comprises a second surface opposite to the solid state disk and an engaging portion formed on the second surface, the engaging portion comprising two limiting ribs and a hook bulged up from the second surface, the limiting ribs are stripe-shaped and arranged in parallel, the hook is positioned between the limiting ribs, the solid state disk assembly comprises a clamping member, the clamping member comprises a pair of substantially parallel clamping plates and two connection portions, each clamping plate comprises a first section plate and two second section plates perpendicularly extending up from two distal ends of the first section plate, each connection portion is connected between the clamping plates by perpendicular connecting to an end of one of the first section plate of each clamping plate, all of the solid state disk, the first heat conducting member, and the second heat conducting member are clamped between the two clamping plates, one of the clamping plates is slid between the limiting ribs until the corresponding first section plate passing and hooked by the hook.

2. The solid state disk assembly as claimed in claim 1, wherein the solid state disk is a serial technology attachment dual-inline-memory-module solid state disk.

3. The solid state disk assembly as claimed in claim 1, wherein each of the engaging arms defines a recess at a distal end thereof, and each elastic arm is partially received and clamped in a corresponding recess.

4. The solid state disk assembly as claimed in claim 3, wherein the first heat conducting member further comprises a first surface opposite to the second surface, a pair of first long sides, and a pair of first short sides; each of the elastic arms extends from a first short side along a direction perpendicular to the second surface and away from the second surface, the at least one pair of elastic arms are aligned with each other; the second heat conducting member comprising a third surface, a fourth surface opposite to the third surface, a pair of second long sides, and a pair of second short sides; each engaging arm is a shaped extension of a respective one of the second short sides; and the first surface abuts on the chipset and the third surface attaches on the rear surface.

5. The solid state disk assembly as claimed in claim 4, wherein the first heat conducting member comprises one pair of elastic arms, the second heat conducting member comprises one pair of engaging arms.

6. The solid state disk assembly as claimed in claim 5, wherein each of the first end and the second end defines an aligning notch, each aligning notch is aligned with a respective recess, each elastic arm is also partially received in a respective notch.

7. The solid state disk assembly as claimed in claim 4, wherein the second heat conducting member further comprises a pair of second limiting ribs corresponding to the pair of first limiting ribs, and the other clamping plate attached on the fourth surface is located between the pair of second limiting ribs.

8. The solid state disk assembly as claimed in claim 4, wherein a middle of the second surface is stepped out from the first surface forming a groove in the first surface and a protruding portion on the second surface.

9. The solid state disk assembly as claimed in claim 1, wherein the first heat conducting member, the second conducting member, and the clamping member are made of aluminum.

* * * * *